(12) United States Patent
Lin

(10) Patent No.: US 11,647,604 B1
(45) Date of Patent: May 9, 2023

(54) RACK DEVICE FOR MOUNTING SERVER ON MULTIPLE TYPES OF FRAME

(71) Applicant: Nanning FuLian FuGui Precision Industrial Co., Ltd., Nanning (CN)

(72) Inventor: Chih-Hsuan Lin, New Taipei (TW)

(73) Assignee: Nanning FuLian FuGui Precision Industrial Co., Ltd., Nanning (CN)

( * ) Notice: Subject to any disclaimer, the term of this patent is extended or adjusted under 35 U.S.C. 154(b) by 0 days.

(21) Appl. No.: 17/585,798

(22) Filed: Jan. 27, 2022

(51) Int. Cl.
  *H05K 7/14* (2006.01)
  *H05K 7/18* (2006.01)

(52) U.S. Cl.
  CPC ............ *H05K 7/1489* (2013.01); *H05K 7/183* (2013.01)

(58) Field of Classification Search
  CPC ...... H05K 7/1489; H05K 7/18; H05K 7/1488; H05K 7/1497; H05K 7/183; B21D 5/00; G11B 33/12; G11B 33/123; F16M 13/022; F16M 13/02; F16M 13/025
  See application file for complete search history.

(56) References Cited

U.S. PATENT DOCUMENTS

| | | | |
|---|---|---|---|
| 6,739,682 B2 | 5/2004 | Shih | |
| 9,122,459 B2 * | 9/2015 | Peng | G06F 1/187 |
| 10,667,424 B2 * | 5/2020 | Lin | H05K 7/1411 |
| 2010/0243586 A1 * | 9/2010 | Henderson | H05K 7/1489 248/220.21 |
| 2020/0112774 A1 * | 4/2020 | Lee | H04Q 1/025 |

FOREIGN PATENT DOCUMENTS

| | | |
|---|---|---|
| CN | 201063126 Y | 5/2008 |
| EP | 3905865 A1 | 11/2021 |
| TW | 201328476 A1 | 7/2013 |
| TW | I632883 B | 8/2018 |

* cited by examiner

*Primary Examiner* — Ko H Chan
(74) *Attorney, Agent, or Firm* — ScienBiziP, P.C.

(57) ABSTRACT

A rack device for mounting server in a 2-post or in a 4-post frame includes a fixture rack, a sliding rack, a connection rack, and a handle. The fixture rack is affixed to a casing. The sliding rack is slidably disposed on the fixture rack. The connection rack is pivoted on one end of the sliding rack. The handle is pivoted on the fixture rack about a first shaft. When the casing is mounted on a 2-post frame, an end of the fixture rack is affixed to a main post, and the sliding rack is at a storage position. When the casing is mounted on a 4-post frame, the end of the fixture rack is affixed to a rear post, the sliding rack is extended to an extension position relative to the fixture rack, and the connection rack is affixed to a front post.

10 Claims, 10 Drawing Sheets

RACK DEVICE FOR MOUNTING SERVER ON MULTIPLE TYPES OF FRAME

FIELD

The subject matter herein generally relates to server storage, particularly a rack device for mounting a server on a frame.

BACKGROUND

In order to increase the density of servers, multiple servers are generally installed on the same frame. There are two types of conventional frames. The first type is 2-post frame. The 2-post frame includes two main posts, and the rear side of the server is mounted on the main post by rack devices.

The second type is 4-post frame. The 4-post frame includes two front posts and two rear posts. The front side of the server is mounted on the front posts, and the rear side of the server is mounted on the rear posts via by devices. Moreover, in order to accommodate various servers of different sizes, telescopic tracks are installed on the rack devices so that servers of different sizes can be installed on the same frame.

In the conventional art, the 2-post frame and the 4-post frame correspond to different rack devices, so it is difficult for the server to adapt between the 2-post frame and the 4-post frame.

BRIEF DESCRIPTION OF THE DRAWINGS

Many aspects of the present disclosure are better understood with reference to the following drawings. The components in the drawings are not necessarily drawn to scale, the emphasis instead being placed upon clearly illustrating the principles of the present disclosure. It will be appreciated that for simplicity and clarity of illustration, where appropriate, reference numerals have been repeated among the different figures to indicate corresponding or analogous elements.

DETAILED DESCRIPTION

Figure 1:
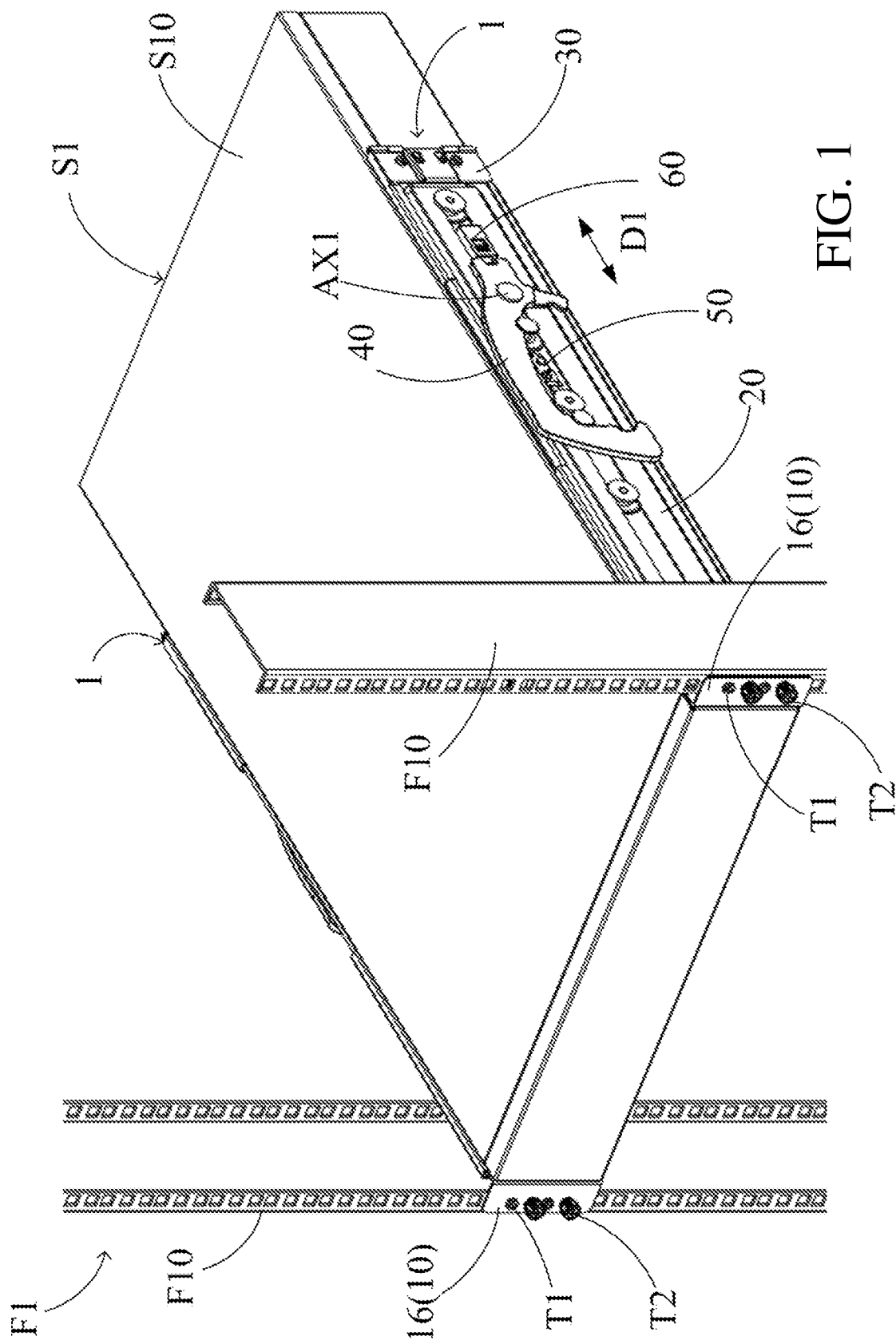
FIG. 1 is a perspective view of a rack device mounted on a 2-post frame in accordance with an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The disclosure is illustrated by way of embodiments and not by way of limitation in the figures of the accompanying drawings, in which like references indicate similar elements. It should be noted that references to "an" or "one" embodiment in this disclosure are not necessarily to the same embodiment, and such references mean "at least one."

The term "connected" is defined as directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series, and the like.

Figure 2:
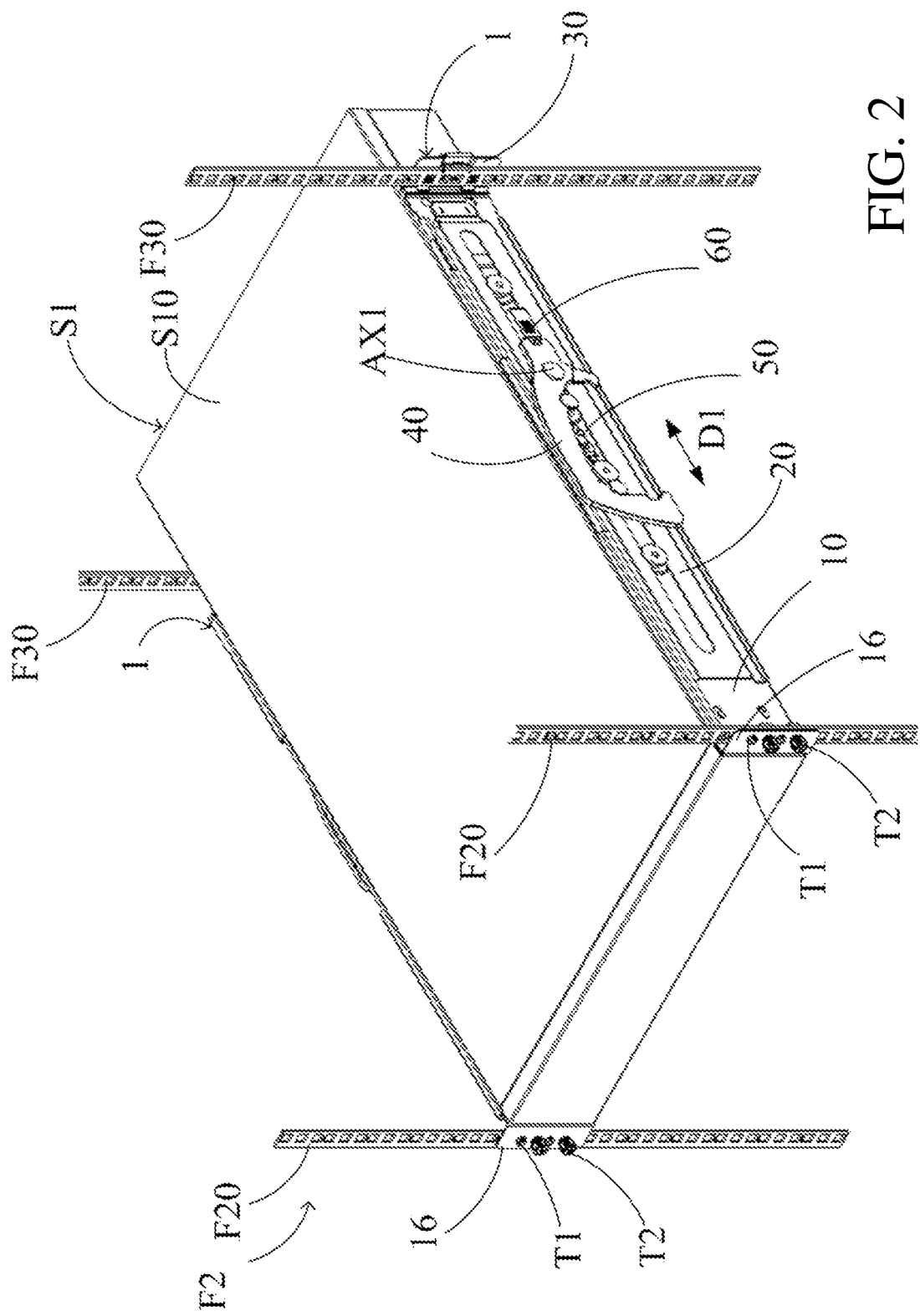
FIG. 2 is a perspective view of the rack device of FIG. 1 mounted on a 4-post frame.
Figure 3:
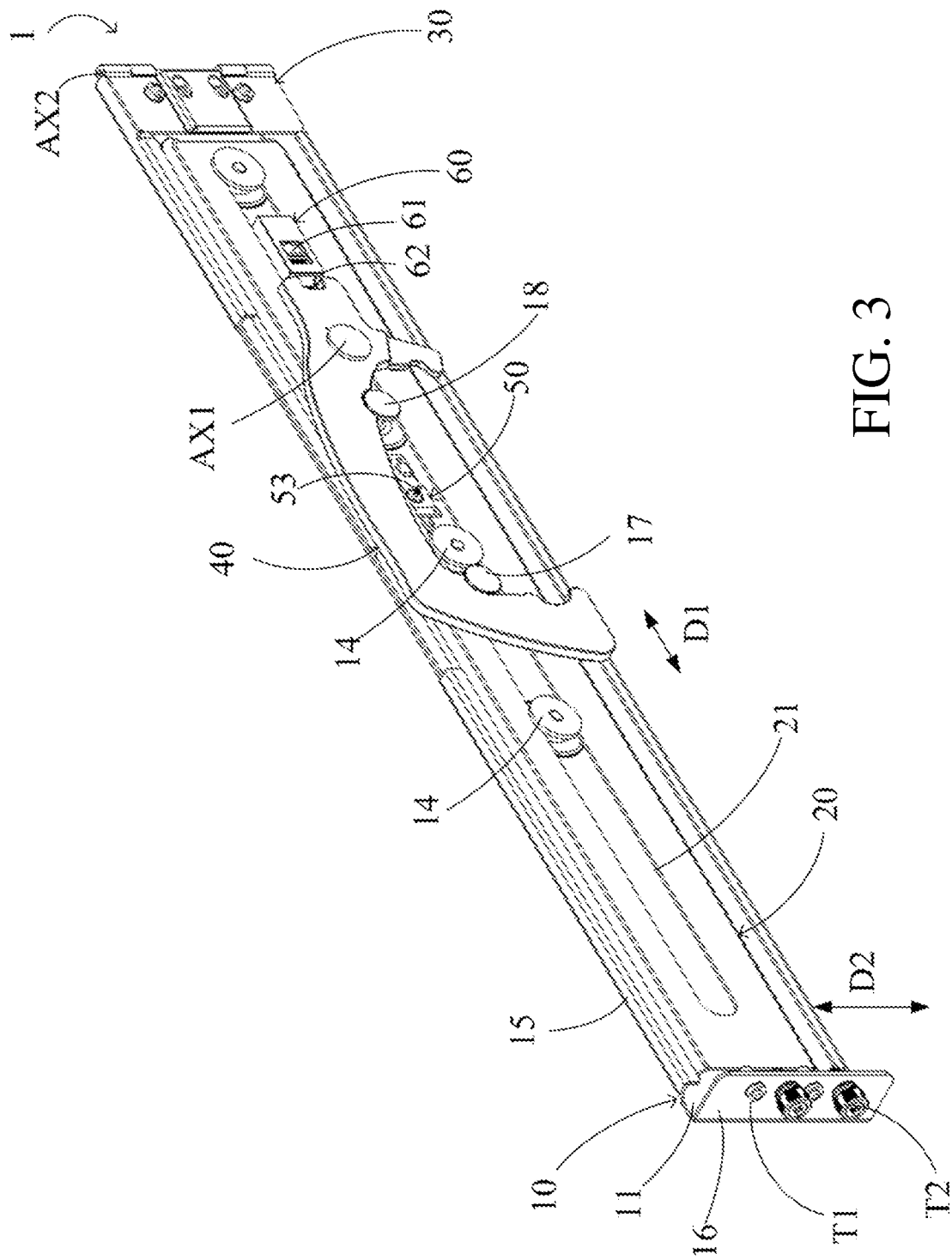
FIG. 3 is a perspective view of the rack device of FIG. 1.
Figure 4:
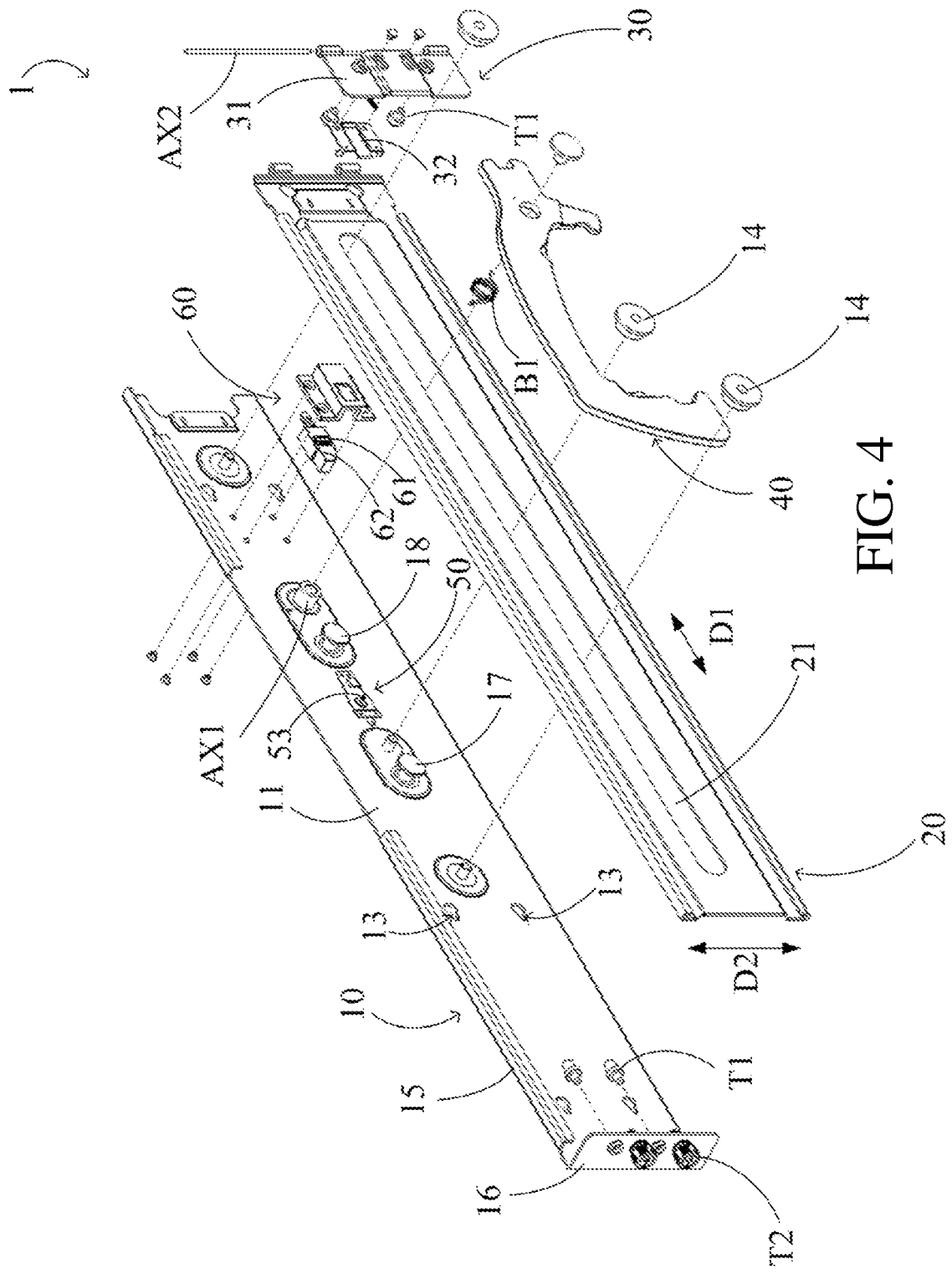
FIG. 4 is an exploded view of the rack device of FIG. 3.

FIG. 1 is a perspective view of a rack device 1 mounted on a 2-post frame F1 in accordance with an embodiment of the present disclosure. FIG. 2 is a perspective view of the rack device 1 of FIG. 1 mounted on a 4-post frame F2. FIG. 3 is a perspective view of the rack device 1 of FIG. 1. FIG. 4 is an exploded view of the rack device 1 of FIG. 3. The rack device 1 can be applied to the 2-post frame F1 and to the 4-post frame F2. There are two rack devices 1 mounted on opposite side walls of the casing 10 of the server S1. The rack device 1 can mount the server S1 on the 2-post frame F1 or on the 4-post frame F2. The server S1 is a network communication server, or a data processing server, not limited thereto.

Each rack device 1 includes a fixture rack 10, a sliding rack 20, a connection rack 30, and a handle 40. The fixture rack 10 is configured to be affixed to the side wall of the casing S10 of the server S1. The sliding rack 20 is slidably disposed on the fixture rack 10. The sliding rack 20 and the fixture rack 10 are elongated structures, extending in a longitudinal direction D1. The sliding rack 20 can move in the longitudinal direction D1 relative to the fixture rack 10. The connection rack 30 is pivoted on one end of the sliding rack 20. The handle 40 is pivoted on the fixture rack 10 about a first shaft AX1. The casing S10 can be conveniently moved by manipulating the handle 40.

When the casing S10 is mounted on the 2-post frame F1, one end of the fixture rack 10 is affixed to the main post F10, and the sliding rack 20 is at a storage position. When the casing S10 is mounted on the 4-post frame F2, one end of the fixture rack 10 is affixed to the rear post F20, the sliding rack 20 is extended out relative to the fixture rack 10, and the connection rack 30 is affixed to the front post F30. Therefore, the server S1 can be mounted on the 2-post frame F1 or on the 4-post frame F2 by the rack device 1. Server S1 can be mounted on different types of racks and the inconvenience of requiring different types of racks for mounting a server S1 is avoided.

Figure 5:
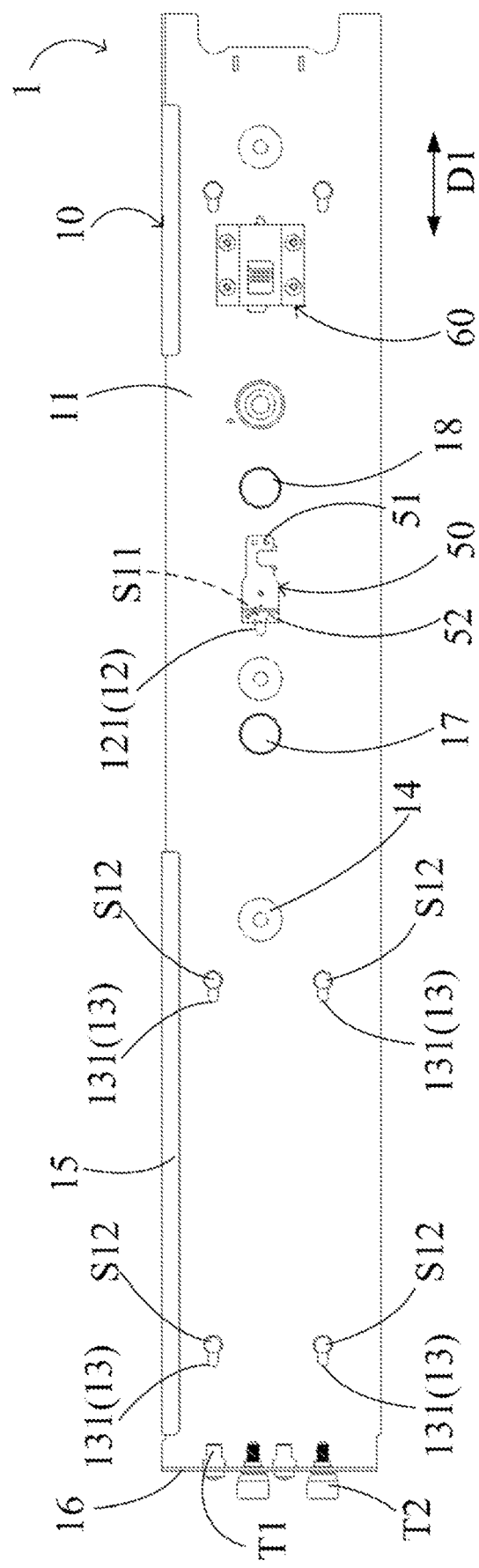
FIG. 5 is a front view of the fixture rack of FIG. 3, wherein the fixture rack is at a detaching position.
Figure 6:
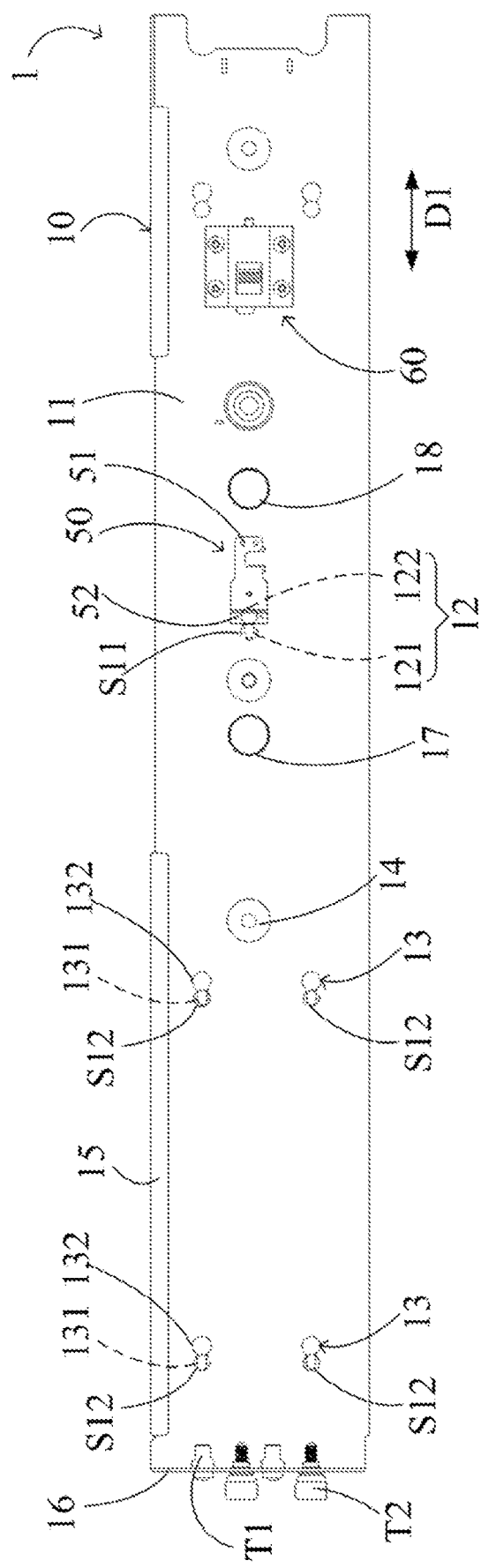
FIG. 6 is a front view of the fixture rack of FIG. 3, wherein the fixture rack is at a fixing position.

FIG. 5 is a front view of the fixture rack 10 of FIG. 3, wherein the fixture rack 10 is at a detaching position. FIG. 6 is a front view of the fixture rack 10 of FIG. 3, wherein the fixture rack 10 is at a fixing position. In this embodiment, the server S1 further includes one or more first pins S11 and one or more second pins S12. The first pin S11 and the second pin S12 are disposed on opposite side walls of the casing S10 (as shown in FIG. 1 and FIG. 2). The first pin S11 and the second pin S12 are T-shaped structures. The fixture rack 10 includes a fixture body 11, a first lock hole 12, and second lock holes 13. The fixture body 11 may be a plate, extending in a longitudinal direction D1. The first lock hole 12 and the second lock hole 13 pass through the fixture body 11. The first pin S11 passes through the first lock hole 12, and the second pin S12 passes through the second lock hole 13.

The first lock hole 12 includes a first narrow segment 121 and a first wide segment 122. The first narrow segment 121 is connected to the first wide segment 122, and the first narrow segment 121 and the first wide segment 122 are arranged in the longitudinal direction D1. The width of the first narrow segment 121 is less than the width of the first wide segment 122, the widths being measured in a direction perpendicular to the longitudinal direction D1.

The second lock hole 13 includes a second narrow segment 131 and a second wide segment 132. The second narrow segment 131 is connected to the second wide segment 132, and the second narrow segment 131 and the second wide segment 132 are arranged in the longitudinal direction D1. The width of the second narrow segment 131 is less than the width of the second wide segment 132, the widths again being measured in the direction perpendicular to the longitudinal direction D1. FIG. 6 shows the rod portion of the first pin S11 in the first narrow segment 121, and the rod portion of the second pin S12 in the second narrow segment 131. As shown in FIG. 5, when the rod portion of the first pin S11 is in the first wide segment 122, the rod portion of the second pin S12 is in the second wide segment 132.

When the fixture rack 10 is at the fixing position on the casing S10, as shown in FIG. 6, the rod portion of the first pin S11 is in the first narrow segment 121 of the first lock hole 12, and the rod portion of the second pin S12 is in the second narrow segment 131. In the embodiment, the width of the head portion of the first pin S11 is greater than the width of the first narrow segment 121, the width of the head portion of the second pin S12 being greater than the width of the second narrow segment 131. Therefore, the first pin S11 and the second pin S12 prevent separation of the fixture rack 10 from the casing S10 via the first narrow segment 121 and the second narrow segment 131.

In this embodiment, the rack device 1 further includes a locking mechanism 50 disposed on the fixture rack 10, adjacent to the first lock hole 12. The locking mechanism 50 prevents or allows movement of the first pin S11 in the first lock hole 12. In this embodiment, the locking mechanism 50 is a metal plate, and includes a fixture end 51 and a free end 52. The fixture end 51 is affixed to the fixture rack 10, and the free end 52 covers the first wide segment 122. When the fixture rack 10 is mounted on the casing S10, as shown in FIG. 6, the free end 52 of the locking mechanism 50 abuts the head portion of the first pin S11, so as to restrict the rod portion of the first pin S11 to first narrow segment 121. The rod portion of the second pin S12 is restricted to the second narrow segment 131. Thereby, the fixture rack 10 can be affixed to the casing S10 by the locking mechanism 50.

When the fixture rack 10 is to be removed from the casing S10, the locking mechanism 50 is bent by the user so that the free end 52 of the locking mechanism 50 is separated from the fixture rack 10. In some embodiments, the locking mechanism 50 includes a rod 53. The locking mechanism 50 can be bent by moving the rod 53.

When the locking mechanism 50 is bent, the locking mechanism 50 allows the first pin S11 to move in the first lock hole 12. Afterwards, the fixture rack 10 is moved to the detaching position in FIG. 5 in the longitudinal direction D1. Therefore, the rod portion of the first pin S11 is moved to the first wide segment 122 of the first lock hole 12, and the rod portion of the second pin S12 is moved to the second wide segment 132.

In this embodiment, the width of the head portion of the first pin S11 is not more than the width of the first wide segment 122, and the width of the head portion of the second pin S12 is not more than the width of the second wide segment 132. The first pin S11 can pass through the first wide segment 122, and the second pin S12 can pass through the second wide segment 132. Thereby, the fixture rack 10 can be detached from the casing S10. Accordingly, in this embodiment, the rack device 1 can be mounted on or removed from the casing S10 without tools.

The sliding rack 20 includes a main opening 21, extending in the longitudinal direction D1, the length of the main opening 21 is longer than a half of the length of the sliding rack 20. In this embodiment, the locking mechanism 50 is in the main opening 21. The fixture rack 10 further includes guide parts 14 and a track 15. The guide parts 14 are disposed on the fixture body 11. The guide parts 14 are in the main opening 21, and are arranged in the longitudinal direction D1.

In this embodiment, the guide part 14 is a T-shaped structure, and the rod portion of the guide part 14 is in the main opening 21, the head portion of the guide part 14 covers the edge of the main opening 21. The track 15 is disposed on the fixture body 11 at the edge of the fixture body 11. The track 15 extends in the longitudinal direction D1, and the edge of the sliding rack 20 is in the track 15. Therefore, the movement of the sliding rack 20 relative to the fixture rack 10 is restricted in the longitudinal direction D1 by the guide part 14 and/or the track 15.

The fixture rack 10 further includes a fixture plate 16 connected to the fixture body 11. The fixture plate 16 extends perpendicular to the fixture body 11. The rack device 1 further includes one or more positioning latches T1, and one or more fasteners T2. The positioning latch T1 and the fastener T2 can be disposed on the fixture plate 16, and can be inserted into the main post F10 of FIG. 1 or into the rear post F20 of FIG. 2. The positioning latch T1 can position the rack device 1 at the main post F10 or at the rear post F20. The fastener T2 can be fastened to the main post F10 or the rear post F20 via a threaded nut (not shown) on the main post F10 or the rear post F20. Therefore, the rack device 1 can be mounted on the 2-post frame F1 or the 4-post frame F2 without tools.

Figure 7:
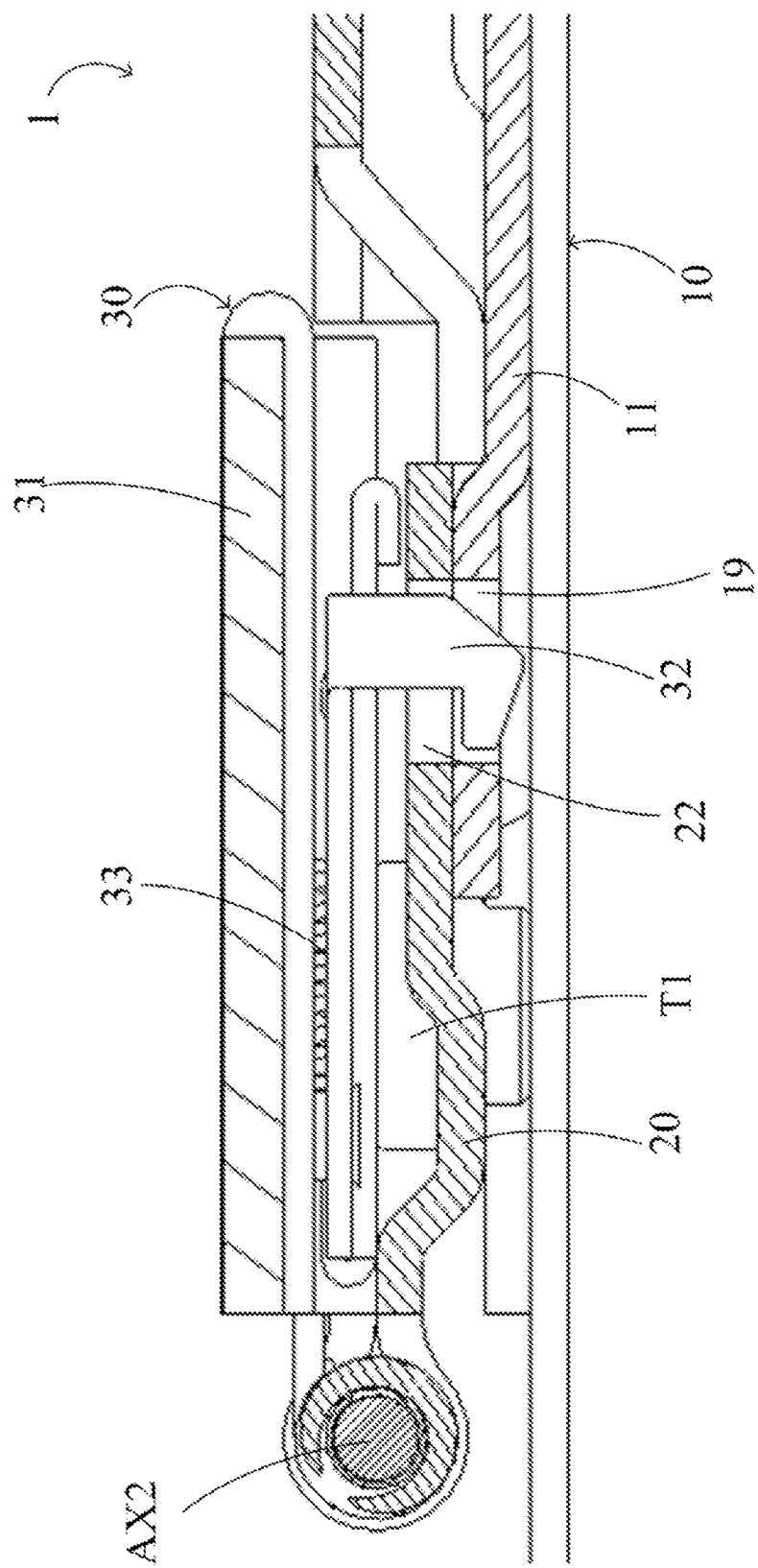
FIG. 7 is a cross-sectional view of the rack device of FIG. 3, wherein the connection rack is at a storage position.
Figure 8:
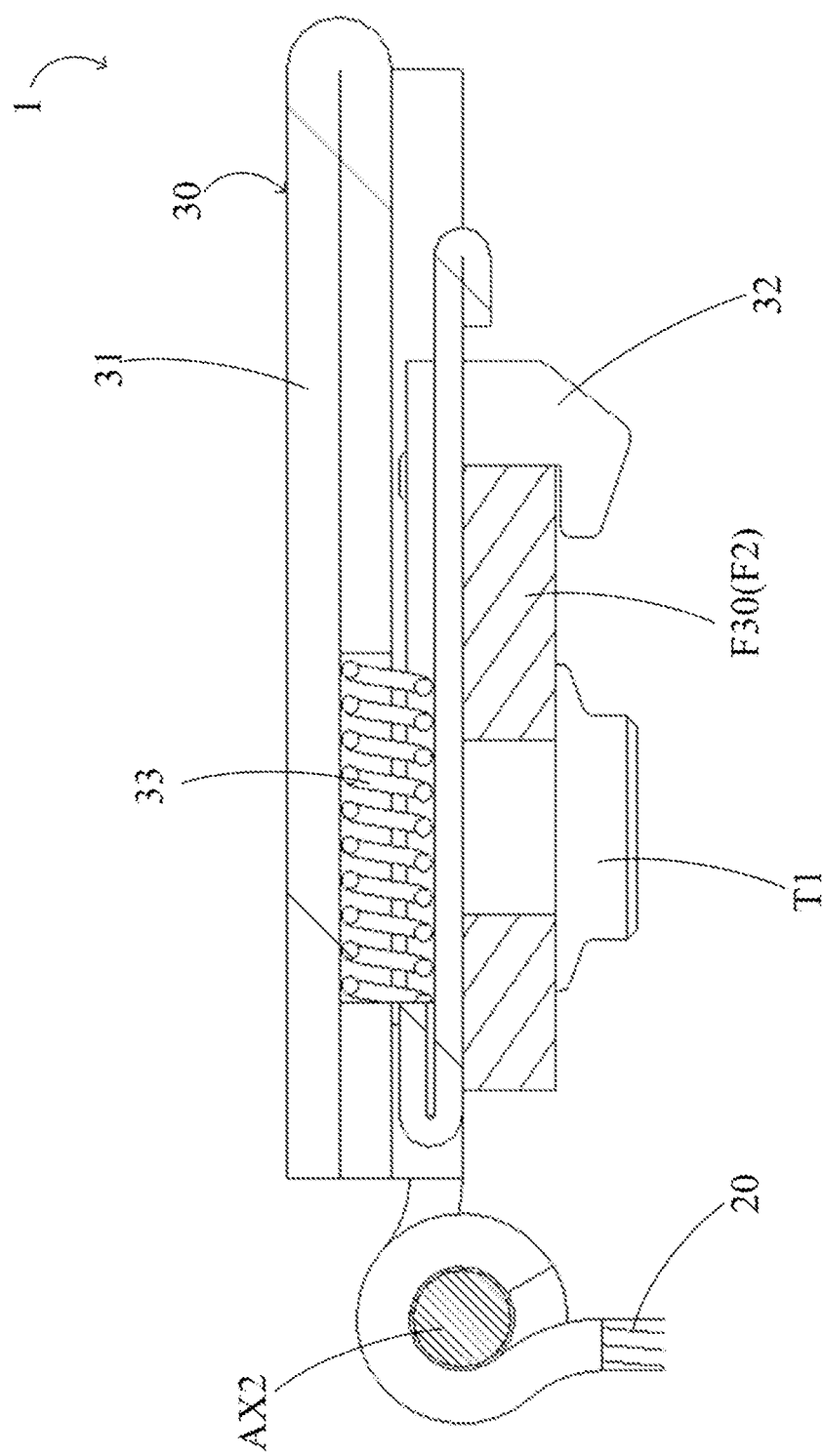
FIG. 8 is a cross-sectional view of the rack device of FIG. 3, wherein the connection rack 30 is at a mounting position.

FIG. 7 is a cross-sectional view of the rack device 1 of FIG. 3, wherein the connection rack 30 is at a storage position. FIG. 8 is a cross-sectional view of the rack device 1 of FIG. 3, wherein the connection rack 30 is at a mounting position. The connection rack 30 includes a rotation plate 31, a hook structure 32, and a connection spring 33. The rotation plate 31 is pivoted on one end of the sliding rack 20. The hook structure 32 is movably disposed on the rotation plate 31. The connection spring 33 is disposed on the rotation plate 31, and provides an elastic force to the hook structure 32. In this embodiment, the connection rack 30 further includes a torsion spring (not shown in figures) disposed on the second shaft AX2. The torsion spring provides a twisting force between the rotation plate 31 and the fixture rack 10, and so as to rotate the rotation plate 31 to the storage position.

As shown in FIG. 7, when the sliding rack 20 is at the storage position, the hook structure 32 is engaged in a first slot 19 of the fixture body 11 of the fixture rack 10, and engaged in a second slot 22 of the sliding rack 20. Therefore, the movement of the sliding rack 20 relative to the fixture rack 10 is restricted by the hook structure 32.

As shown in FIG. 2 and FIG. 8, when the rack device 1 is mounted on the 4-post frame F2, the rotation plate 31 is rotated and the hook structure 32 is moved to engage the hook structure 32 in the front post F30. Moreover, the positioning latch T1 can be disposed in the rotation plate 31, and configured to be inserted in the front post F30. The positioning latch T1 can position the rack device 1 to the front post F30. Thereby, the rack device 1 can be mounted on the 4-post frame F2 without tools.

Figure 9:
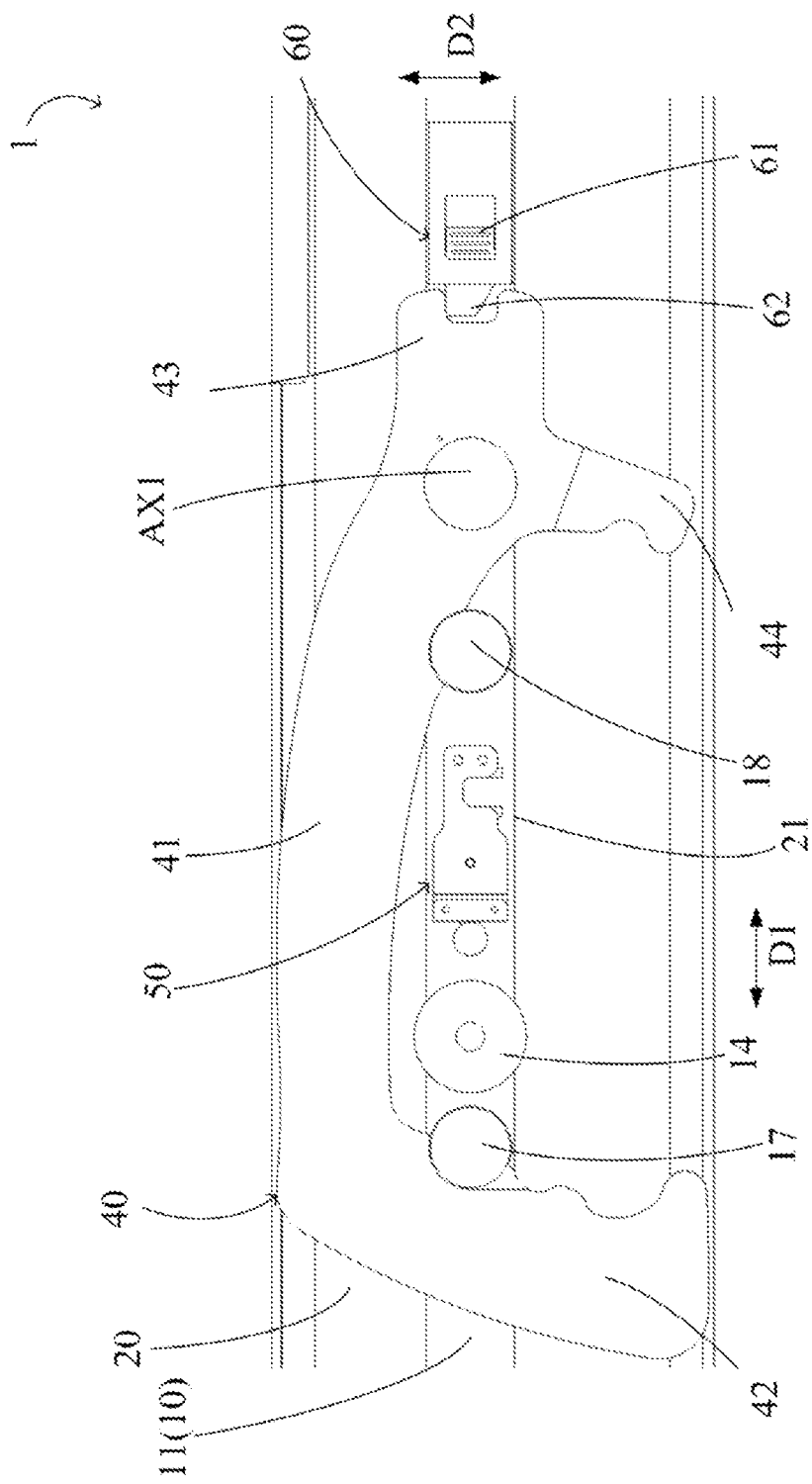
FIG. 9 is a front view of the rack device of FIG. 3, wherein the handle is at a locked position.
Figure 10:
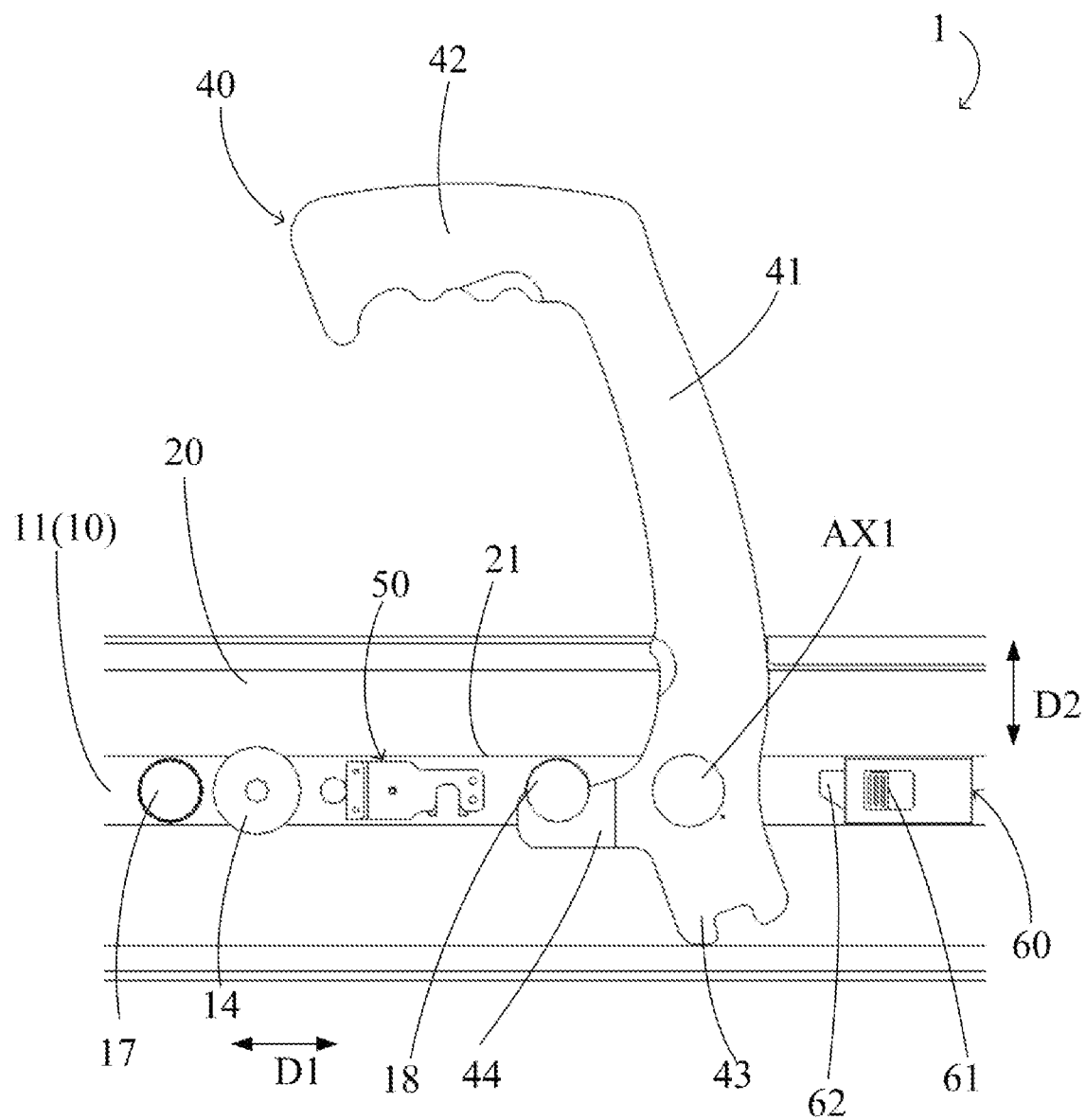
FIG. 10 is a front view of the rack device of FIG. 3, wherein the handle is at a releasing position.

FIG. 9 is a front view of the rack device 1 of FIG. 3, wherein the handle 40 is at a locked position. FIG. 10 is a front view of the rack device 1 of FIG. 3, wherein the handle 40 is at a releasing position. The rack device 1 further includes an elastic element B1 (as shown in FIG. 4) disposed on the first shaft AX1, and connected to the handle 40 and the fixture rack 10. The elastic element B1 provides a twisting force to the handle 40, and rotates the handle 40 relative to the fixture rack 10. The rack device 1 further includes a switching mechanism 60 disposed on the fixture rack 10 in the main opening 21. The switching mechanism 60 maintains the handle 40 in the locked position. The handle 40 can be released by operating the switching mechanism 60, and the handle 40 rotated to the releasing position relative to the fixture rack 10 by the elastic element B1.

The handle 40 includes a body 41, a handle portion 42, a first restriction portion 43, and a second restriction portion 44. The body 41 is pivoted on the fixture rack 10 about the first shaft AX1. The first shaft AX1 is in the main opening 21. The body 41 can be an elongated structure. The handle portion 42, the first restriction portion 43, and the second restriction portion 44 are connected to the body 41. The handle portion 42 and the body 41 form an L-shaped structure. The handle portion 42 is connected to one end of the body 41, and the first restriction portion 43 is connected to the other end of the body 41. The handle portion 42, the body 41, and the second restriction portion 44 form a U-shaped structure. When the handle 40 is in the locked position, the handle portion 42 of the handle 40 does not protrude over the fixture rack 10 in a transverse direction D2 perpendicular to the longitudinal direction D1. Therefore, the handle 40 is stored on one side of the fixture rack 10. When the handle 40 is at the releasing position, the handle portion 42 of the handle 40 protrudes over the fixture rack 10 and the sliding rack 20 in the transverse direction D2. Therefore, the handle 40 can be manipulated conveniently.

The fixture rack 10 further includes a first constraining part 17 and a second constraining part 18. The first constraining part 17 and the second constraining part 18 are disposed on the fixture body 11, and in the main opening 21 of the sliding rack 20. The switching mechanism 60 includes a button 61 and a retaining latch 62. When the button 61 is pushed, the retaining latch 62 is moved. When the button 61 is released, the retaining latch 62 is returned to an initial position by a spring (not shown) in the switching mechanism 60. When the handle 40 is restricted to the locked position by the switching mechanism 60, the retaining latch 62 is engaged to the first restriction portion 43. The handle portion 42 contacts or engages the first constraining part 17, the body 41 contacts or contacts or engages the second constraining part 18, and the second restriction portion 44 is separated from the second constraining part 18. Thereby, the handle 40 can be stored securely on the side of the fixture rack 10.

As shown in FIG. 10, when the handle 40 is released by the switching mechanism 60, the retaining latch 62 is separated from the first restriction portion 43.

The handle portion 42 is separated from the first constraining part 17, the body 41 is separated from the second constraining part 18, and the second restriction portion 44 contacts or engages the second constraining part 18. Therefore, when the user turns the handle portion 42 to lift the rack device 1 and the casing S10 (as shown in FIG. 1 and FIG. 2), the second constraining part 18 prevents the handle 40 from rotating clockwise relative to the fixture rack 10 as in FIG. 10. Therefore, the user can easily lift the casing S10. When storage is required, the handle 40 can be rotated counterclockwise in FIG. 10 until the first restriction portion 43 pushes the retaining latch 62 to move toward the inside of the switching mechanism 60. Afterwards, the retaining latch 62 is ejected from the inside of the switching mechanism 60 and engages with the first restriction portion 43.

In the present disclosure, the rack device can be applied to 2-post frame and 4-post frame for securing servers within a 2-post frame and within a 4-post frame. In addition, the rack device can be mounted on the casing without tools.

Many details are often found in the relevant art, thus many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will, therefore, be appreciated that the embodiments described above may be modified within the scope of the claims.

What is claimed is:

1. A rack device comprising:
   a fixture rack configured to be affixed to a casing;
   a sliding rack slidably disposed on the fixture rack;
   a connection rack pivoted on an end of the sliding rack;
   a handle pivoted on the fixture rack about a first shaft;
   wherein when the casing is mounted on a 2-post frame, an end of the fixture rack is affixed to a main post, and the sliding rack is at a storage position,
   when the casing is mounted on a 4-post frame, the end of the fixture rack is affixed to a rear post, the sliding rack is extended to an extension position relative to the fixture rack, and the connection rack is affixed to a front post.

2. The rack device as claimed in claim 1, further comprising:
   an elastic element connected to the handle and the fixture rack; and
   a switching mechanism disposed on the fixture rack, and configured to restricted the handle to a locked position;
   wherein the handle is released by operating the switching mechanism, and the handle is rotated to a releasing position relative to the fixture rack by the elastic element.

3. The rack device as claimed in claim 2, wherein the handle comprises:
   a body pivoted on the fixture rack by the first shaft;
   a handle portion connected to the body;
   a first restriction portion connected to the body; and a second restriction portion connected to the body;

wherein when the handle is restricted to the locked position by the switching mechanism, a retaining latch of the switching mechanism is engaged to the first restriction portion, when the handle is released by the switching mechanism, the retaining latch is separated from the first restriction portion.

4. The rack device as claimed in claim 3, wherein the fixture rack further comprises a first constraining part and a second constraining part, wherein when the handle is at the locked position, the handle portion contacts the first constraining part, the body contacts the second constraining part, and the second restriction portion is separated from the second constraining part, when the handle is at the releasing position, the handle portion is separated from the first constraining part, the body is separated from the second constraining part, and the second restriction portion contacts the second constraining part.

5. The rack device as claimed in claim 1, wherein the connection rack further comprises:

a rotation plate pivoted on the sliding rack about a second shaft; and a hook structure disposed on the rotation plate, wherein when the sliding rack is at the storage position, the hook structure is engaged in a first slot of the fixture rack, when the casing is mounted on the 4-post frame, the hook structure is engaged to the front post.

6. The rack device as claimed in claim 5, wherein the hook structure is movably disposed on the rotation plate, and the connection rack further comprises a connection spring disposed on the rotation plate and providing an elastic force to the hook structure.

7. The rack device as claimed in claim 1, further comprising a locking mechanism disposed on the fixture rack, and a first pin disposed on the casing, wherein the fixture rack further comprises a first lock hole, the first pin passes through the first lock hole, and the locking mechanism is configured to restrict or allow the first pin moving in the first lock hole.

8. The rack device as claimed in claim 7, wherein the lock hole further comprises a first narrow segment and a first wide segment, when the first pin is restricted in the first narrow segment by the locking mechanism, the fixture rack is affixed to the casing, and when the locking mechanism allows the first pin to be moved in the first wide segment, the fixture rack is allowed to be detached from the the casing.

9. The rack device as claimed in claim 8, further comprising a second pin disposed in the casing, wherein the fixture rack further comprises a second lock hole, and the second lock hole comprises a second narrow segment and a second wide segment, when the first pin is in the first narrow segment, the second pin is in the second narrow segment, and when the first pin is in the first wide segment, the second pin is in the second wide segment.

10. The rack device as claimed in claim 1, wherein the sliding rack comprises a main opening, the fixture rack further comprises a guide part in the main opening, wherein the guide part is configured to restrict the sliding rack moving relative to the fixture rack in a longitudinal direction.

* * * * *